(12) United States Patent
Kim et al.

(10) Patent No.: US 9,082,368 B2
(45) Date of Patent: Jul. 14, 2015

(54) SEMICONDUCTOR DEVICES HAVING IMAGE SENSOR AND MEMORY DEVICE OPERATION MODES

(71) Applicant: Samsung Electronics Co., Ltd., Suwon-si, Gyeonggi-do (KR)

(72) Inventors: Sunjung Kim, Gyeonggi-do (KR); Wang Hyun Kim, Gyeonggi-do (KR); Kwanghyun Lee, Gyeonggi-do (KR); Seokyong Hong, Seoul (KR); Seunghoon Lee, Gyeonggi-do (KR); JuHwan Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 83 days.

(21) Appl. No.: 14/050,993

(22) Filed: Oct. 10, 2013

(65) Prior Publication Data

US 2014/0104263 A1    Apr. 17, 2014

Related U.S. Application Data

(60) Provisional application No. 61/713,175, filed on Oct. 12, 2012.

(30) Foreign Application Priority Data

Mar. 4, 2013  (KR) ........................ 10-2013-0022844

(51) Int. Cl.
*G09G 3/36*     (2006.01)
*G11C 11/403*   (2006.01)
(Continued)

(52) U.S. Cl.
CPC ................ *G09G 3/3696* (2013.01); *G09G 3/02* (2013.01); *G09G 3/2092* (2013.01); *G09G 5/39* (2013.01);
(Continued)

(58) Field of Classification Search
CPC ...... G09G 3/3696; G09G 3/02; G09G 3/2092; G09G 5/39; G11C 11/403; G11C 11/4076; H04N 5/37452; H04N 5/3745
USPC ................ 348/294, 308; 365/230.01, 230.03; 257/906, 907, 908, E27.087, E27.088; 250/208.1
See application file for complete search history.

(56) References Cited

U.S. PATENT DOCUMENTS

| | | | |
|---|---|---|---|
| 6,975,324 B1* | 12/2005 | Valmiki et al. | ................ 345/555 |
| 7,148,927 B2 | 12/2006 | Ogura et al. | |
| 7,542,345 B2 | 6/2009 | Okhonin et al. | |
| 7,746,400 B2 | 6/2010 | Mo | |
| 7,791,034 B2 | 9/2010 | Kameshima et al. | |
| 7,859,582 B2 | 12/2010 | Gomi | |
| 8,175,408 B2 | 5/2012 | Hagiwara | |
| 8,208,053 B2 | 6/2012 | Nishihara | |

(Continued)

FOREIGN PATENT DOCUMENTS

| | | |
|---|---|---|
| JP | 2003-319265 A | 5/2002 |
| JP | 2006-094192 A | 10/2004 |
| JP | 2006-270292 A | 3/2005 |

*Primary Examiner* — Tuan Ho
*Assistant Examiner* — Marly Camargo
(74) *Attorney, Agent, or Firm* — Myers Bigel Sibley & Sajovec, PA

(57) ABSTRACT

A semiconductor device may include a plurality of banks; and a control unit configured to receive a command from an external device and independently control the plurality of banks according to the received command. Each bank comprises a pixel array including a plurality of pixels; a row decoder configured to activate word lines connected to the plurality of pixels under control of the control unit; a column decoder configured to activate bit lines connected to the plurality of pixels under control of the control unit; a sense amplifier and write driver configured to control and detect respective voltages of the activated bit lines to provide respective amplified voltages; and an input/output buffer configured to output data states of the pixels based on the respective amplified voltages. Related methods of operation are also discussed.

17 Claims, 15 Drawing Sheets

(51) Int. Cl.
*G11C 11/4076* (2006.01)
*G09G 3/02* (2006.01)
*G09G 3/20* (2006.01)
*G09G 5/39* (2006.01)
*H04N 5/3745* (2011.01)
*H04N 5/355* (2011.01)

(52) U.S. Cl.
CPC .......... *G11C 11/403* (2013.01); *G11C 11/4076* (2013.01); *G09G 2360/142* (2013.01); *G11C 2211/4016* (2013.01)

(56) References Cited

U.S. PATENT DOCUMENTS

| | | | |
|---|---|---|---|
| 2009/0052262 A1* | 2/2009 | Nii | 365/189.14 |
| 2009/0290056 A1 | 11/2009 | Itoh et al. | |
| 2010/0097510 A1 | 4/2010 | Wada et al. | |
| 2010/0217413 A1 | 8/2010 | Seiler | |
| 2011/0002179 A1* | 1/2011 | Kim et al. | 365/193 |
| 2011/0149658 A1* | 6/2011 | Aritome | 365/185.18 |
| 2012/0217413 A1 | 8/2012 | Kameshima et al. | |
| 2012/0224447 A1* | 9/2012 | Kitayama | 365/230.03 |

\* cited by examiner

[Image sensor mode]

[Memory mode]

[Dual mode]

SEMICONDUCTOR DEVICES HAVING IMAGE SENSOR AND MEMORY DEVICE OPERATION MODES

CROSS-REFERENCE TO RELATED APPLICATIONS

This U.S. non-provisional patent application claims priority under 35 U.S.C. §119 to U.S. Provisional Patent Application Ser. No. 61/713,175, filed on Oct. 12, 2012 and Korean Patent Application No. 10-2013-0022844, filed on Mar. 4, 2013, the entire contents of which are hereby incorporated by reference.

BACKGROUND

The present inventive concepts relate to semiconductor devices, and more particularly, to semiconductor devices including a plurality of banks that are independently operable and related methods of operation.

Semiconductor devices can be fabricated using semiconductors such as silicon (Si), germanium (Ga), gallium arsenide (GaAs), indium phosphide (InP), etc. Semiconductor device may be widely used in various fields such as memory devices, logic circuits, sensors, etc.

As semiconductor technology develops, sizes of the semiconductor devices are continually miniaturized. Some DRAM devices may operate based on a memory cell having a structure of 1 transistor-1 capacitor. A capacitor may have a relatively large volume or size as compared with a transistor. As such, DRAM devices having a structure of 1 transistor-1 cell, without a capacitor of a large volume, may be pursued in order to further miniaturize semiconductor devices.

Some CMOS image sensors may have a structure of 3 transistors or 4 transistors. Image sensors having a structure of 1 transistor-1 cell may also be pursued for the miniaturization of semiconductor devices.

SUMMARY

According to some embodiments of the inventive concepts, a semiconductor device includes a plurality of banks; and a control unit configured to receive a command from an external device and independently control the plurality of banks according to the received command. Each bank comprises a pixel array including a plurality of pixels; a row decoder configured to activate word lines connected to the plurality of pixels under control of the control unit; a column decoder configured to activate bit lines connected to the plurality of pixels under control of the control unit; a sense amplifier and write driver configured to control and detect respective voltages of the activated bit lines to provide respective amplified voltages; and an input/output buffer configured to output data states of the pixels based on the respective amplified voltages. The command comprises operation mode information for at least one of the banks. The operation mode information comprises image sensor mode information or memory mode information. The control unit is configured to control at least one of the banks according to the operation mode information such that the at least one of the banks operates in an image sensor mode or a memory mode.

In some embodiments, each of the plurality of pixels comprises an n-type silicon layer; a first insulating layer on the n-type silicon layer; a p-type silicon layer on the first insulating layer; a second insulating layer on the p-type silicon layer; and a gate electrode on the second insulating layer. The p-type silicon layer comprises a drain region, a source region, and floating body region. The drain region and the source region are spaced apart from each other and are doped an n-type impurity.

In some embodiments, the command comprises the image sensor mode information for the at least one of the banks, and wherein the control unit is configured to reset ones of the pixels included in the at least one of the banks in response to the command, to control the row decoder and the column decoder such that the reset ones of the pixels store respective data states according to light being irradiated thereon, and to detect the respective data states of the ones of the pixels.

In some embodiments, the command comprises memory mode information for the at least one of the banks, wherein the control unit is configured to receive addresses and data from the external device, and wherein the control unit is configured to distinguish whether the command comprises a read request or a write request. Responsive to distinguishing that the command comprises a read request, the control unit is configured to detect respective data states of ones of the pixels corresponding to the received addresses and to transmit the detected data states to the external device. Responsive to distinguishing that the command comprises a write request, the control unit is configured to write the received data in ones of the pixels corresponding to the received addresses.

In some embodiments, the command comprises dual mode information indicating a memory mode for ones of the banks and an image sensor mode for other ones of the banks. At this case, ones of the pixels included in the ones of the banks are configured to operate as a memory cell, and others of the pixels included in the other ones of the banks are configured to operate as an image sensor.

In some embodiments, each of the pixels included in the pixel array of at least one of the banks that is configured to operate in the memory mode comprises an n-type silicon layer; a first insulating layer on the n-type silicon layer; a p-type silicon layer on the first insulating layer; a second insulating layer on the p-type silicon layer; a gate electrode on the second insulating layer; and a photo mask on the second insulating layer and the gate electrode. The p-type silicon layer comprises a drain region, a source region, and floating body region. The drain region and the source region are spaced apart from each other and are doped an n-type impurity. The floating body region is configured to store holes. The photo mask is configured to prevent external light from being irradiated into the floating body region.

In some embodiments, the semiconductor device further comprises a storage circuit configured to store operation mode information for each of the banks. The control unit is configured to independently control each of the banks based on the corresponding operation mode information stored in the storage circuit.

According to other embodiments of inventive concept, a method of operating a semiconductor device comprises receiving a command corresponding to at least one of the plurality of banks from an external device; distinguishing whether image sensor mode information is included in the received command; controlling the at least one of the plurality of banks such that a plurality of select pixels included therein operate as an image sensor responsive to distinguishing that the received command includes the image sensor mode information; and controlling the at least one of the plurality of banks such that the plurality of select pixels included therein operate as a memory cell responsive to distinguishing that the received command includes memory mode information. Each of the plurality of banks comprises a pixel array including a plurality of pixels. Each of the plurality of pixels has a structure of 1 transistor-1 cell.

In some embodiments, controlling at least one of the plurality of banks such that the plurality of select pixels included therein operate as an image sensor comprises resetting the plurality of select pixels; controlling the plurality of select pixels to store respective data states according to light being irradiated thereon; detecting the respective data states stored in the plurality of select pixels; and transmitting the detected data states to the external device.

In some embodiments, resetting the plurality of select pixels comprises applying a negative voltage to a word line connected to gate electrodes of the plurality of select pixels; applying a positive voltage to a bit line connected to drain regions of the plurality of select pixels; and applying a ground voltage to a source line connected to source regions of the plurality of select pixels.

In some embodiments, detecting the respective data states stored in the plurality of select pixels comprises sequentially activating word lines and bit lines connected to the plurality of select pixels.

In some embodiments, controlling the at least one of the plurality of banks such that the plurality of pixels included therein operates as a memory cell comprises receiving an address and data from the external device; distinguishing whether the command includes a read request or a write request; and performing a read operation or a write operation of a pixel corresponding to the address responsive to the distinguishing.

In some embodiments, performing the write operation of the pixel corresponding to the address comprises applying a positive voltage to a gate of the pixel corresponding to the address and applying a precharge voltage to a source region and a drain region of the pixel corresponding to the address; changing a voltage of the source region to a ground voltage; and controlling a voltage of a bit line connected to the drain region according to the data.

In some embodiments, controlling the voltage of the bit line connected to the drain region according to the data comprises transiting the voltage of the bit line to ground voltage wherein the data is "data 0" and maintaining the voltage of the bit line to the precharge voltage wherein the data is "data 1".

In some embodiments, performing the read operation comprises activating a word line and a bit line connected to the pixel corresponding to the address to detect a data state thereof; and transmitting the detected data state to the external device.

According to some embodiments of the inventive concepts, a semiconductor device includes a plurality of banks respectively comprising an array of cells, each of the cells comprising a respective transistor. A control circuit is configured to receive a signal indicative of an image sensor operation mode or a memory device operation mode for at least one of the banks from an external device, and is configured to independently operate the at least one of the banks as an image sensor or as a memory device responsive to the signal.

In some embodiments, the respective transistor of each of the cells may include a source region, a drain region, and a floating body region therebetween, and the control circuit may be configured to detect respective data states of the cells based on charge carriers accumulated in the floating body region thereof.

In some embodiments, each of the banks may further include a sense amplifier configured to detect the respective data states of the cells thereof, and a write driver configured program the cells thereof. In operating the at least one of the banks as the image sensor, the control circuit may be configured to disable the write driver thereof.

In some embodiments, in operating the at least one of the banks as the image sensor, the control circuit may be configured to sequentially detect the respective data states of the cells of the at least one of the banks.

In some embodiments, prior to sequentially detecting the respective data states of the cells, the control circuit may be configured to apply a negative voltage to respective gate electrodes of the respective transistors, apply a positive voltage to the respective drain regions of the respective transistors, and apply a ground voltage to the respective source regions of the respective transistors.

In some embodiments, in operating the at least one of the banks as the memory device, the control circuit may be configured to receive an address signal from the external device, and to detect the respective data state of or program one of the cells of the at least one of the banks corresponding to the address signal.

In some embodiments, in programming the one of the cells, the control circuit may be configured to apply a positive voltage to a gate electrode of the respective transistor of the one of the cells corresponding to the address signal, to apply a precharge voltage to the source region and the drain region of the respective transistor of the one of the cells corresponding to the address signal, and to then apply a ground voltage to the source region.

In some embodiments, in programming the data, the control circuit may be further configured to maintain the precharge voltage to the drain region of the respective transistor of the one of the cells corresponding to the address signal to program a first data state therein, and to apply a ground voltage to the drain region of the respective transistor of the one of the cells corresponding to the address signal to program a second data state therein.

In some embodiments, the signal may be indicative of the memory device operation mode for at least one of the banks. The respective transistors of the cells in the at least one of the banks include a photomask layer on the floating body region thereof that is configured to block irradiation of incident light thereon.

In some embodiments, the signal may be indicative of the image sensor operation mode for the at least one of the banks. The signal may be received from the external device independent of an address signal and/or a data signal therefrom.

In some embodiments, the signal may include mode information indicative of the image sensor operation mode or the memory device operation mode for respective ones of the banks. A storage circuit may be configured to store the mode information therein. The control circuit may be further configured to receive a command signal from the external device, and may be configured to operate the at least one of the banks as the image sensor or as the memory device responsive to a comparison of the command signal and the mode information.

In some embodiments, the signal may include dual mode information indicative of the memory device operation mode for a first one of the banks and the image sensor operation mode for a second one of the banks, and the controller may be configured to independently operate the first one of the banks as the memory device and the second one of the banks as the image sensor responsive to the signal.

According to further embodiments of the inventive concepts, a method of operating a semiconductor device includes receiving, from an external device, a signal indicative of an image sensor operation mode or a memory device operation mode for one of a plurality of banks, the plurality of banks respectively comprising a cell array including at least one transistor per cell; and operating the cell array of the one of the plurality of banks as an image sensor or as a memory device responsive to the signal.

BRIEF DESCRIPTION OF THE FIGURES

Embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF THE EMBODIMENTS

Figure 1:
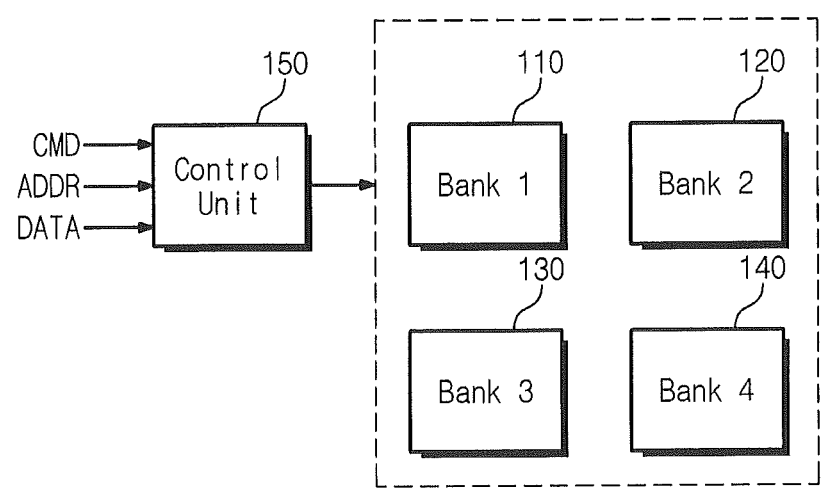
FIG. 1 is a block diagram illustrating a semiconductor device in accordance with some embodiments of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Semiconductor devices in accordance with embodiments of the inventive concepts include a plurality of banks. Each of the plurality of banks may function as any one of an image sensor and a memory device. The plurality of banks are independently operable respectively and thereby a signal sensing delay is reduced. Thus, semiconductor devices having improved performance can be provided.

FIG. 1 is a block diagram illustrating a semiconductor device in accordance with some embodiments of the inventive concepts. Referring to FIG. 1, a semiconductor device 100 includes first to fourth banks 110 to 140 and a control unit 150. Each of the first to fourth banks 110 to 140 may operate as one of an image sensor detecting an external image and a memory device.

The control unit 150 may receive a command CMD, an address ADDR and data DATA from an external device (e.g., a controller, a host, a chipset, etc.). The command CMD may include operation mode information of the first to fourth banks 110 to 140. The first to fourth banks 110 to 140 may operate in one of an image sensor mode, a memory mode, and a dual mode. The image sensor mode is a mode in which pixels of the first to fourth banks 110 to 140 operate as an image sensor. The memory mode is a mode in which the pixels of the first to fourth banks 110 to 140 operate as a random access memory (RAM). The dual mode is a mode in which parts or particular ones of the first to fourth banks 110 to 140 operate as an image sensor and the other parts or remaining ones of the first to fourth banks 110 to 140 operate as a random access memory (RAM).

In the case that the received command CMD includes image sensor mode information, the control unit 150 may control the first to fourth banks 110 to 140 so that the first to fourth banks 110 to 140 operate as an image sensor. In case of the image sensor mode, the semiconductor device 100 performs an operation of outputting image detection data of the first to fourth banks 110 to 140. Thus, the control unit 150 does not receive the address ADDR and the data DATA from an external device. The control unit 150 may sequentially activate a plurality of word lines and a plurality of bit lines connected to the first to fourth banks 110 to 140 to detect data stored in the first to fourth banks 110 to 140.

In the case that the received command CMD includes the memory mode information, the control unit 150 may control the first to fourth banks 110 to 140 so that the first to fourth banks 110 to 140 operate as a random access memory (RAM). The control unit 150 may control the first to fourth banks 110 to 140 based on the address ADDR and the data DATA received from an external device.

In the case that the received command CMD includes the dual mode information, the control unit 150 may controls the first to fourth banks 110 to 140 so that a part of the first to fourth banks 110 to 140 operates as an image sensor and the other part of the first to fourth banks 110 to 140 operates as a random access memory (RAM). Each of operation modes will be more fully described with reference to FIGS. 6 to 8.

In example embodiments, the semiconductor device 100 of FIG. 1 includes the first to fourth banks 110 to 140, but the inventive concept is not limited thereto. The semiconductor device 100 in accordance with some embodiments of the inventive concepts may further include a plurality of banks.

Figure 2:
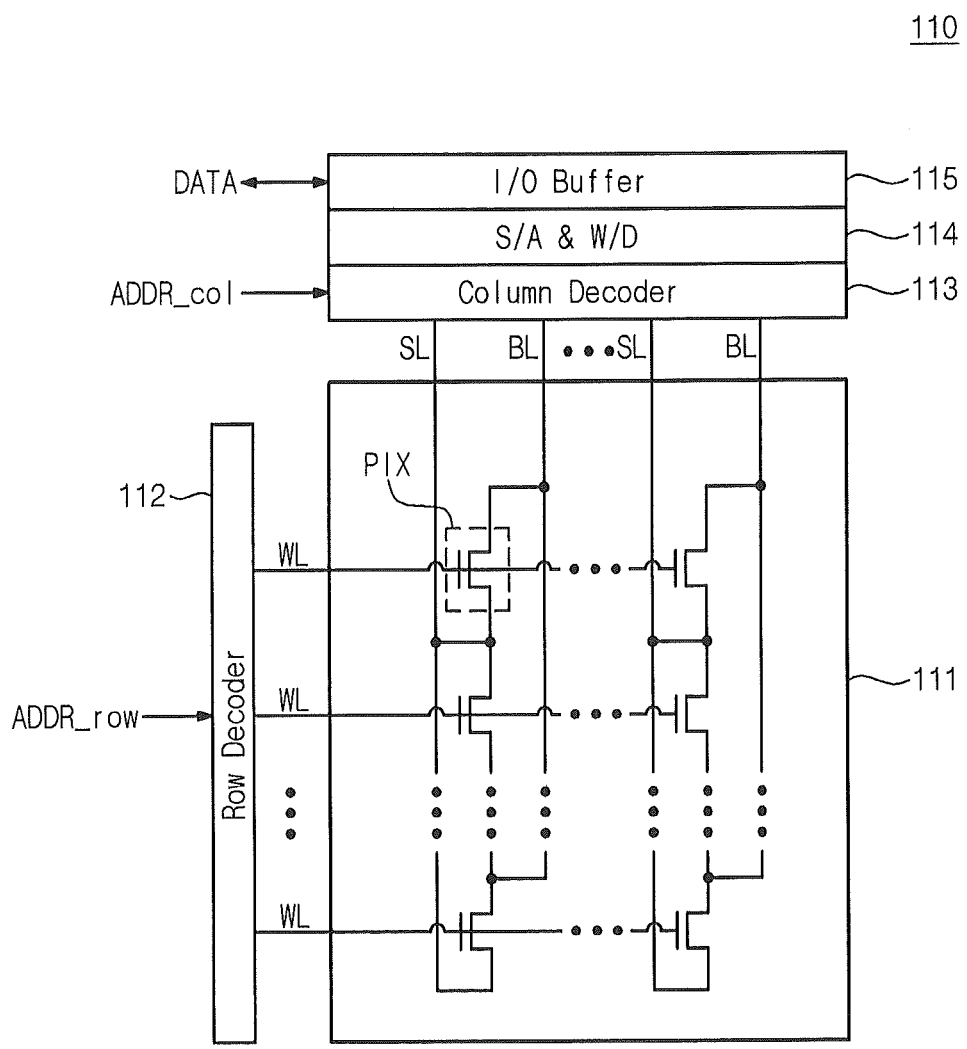
FIG. 2 is a drawing illustrating a first bank of FIG. 1 in greater detail.

FIG. 2 is a drawing illustrating a first bank of FIG. 1 in detail. Although not illustrated in the drawing, the second to fourth banks 120 to 140 also include the same constituent elements as the first bank 110 and perform the same operation as the first bank 110.

The first bank 110 includes a pixel array 111, a row decoder 112, a column decoder 113, a sense amplifier and write driver 114 and an input/output buffer 115. The pixel array 111 may include a plurality of cells or pixels PIX. The plurality of pixels PIX may have a structure of 1 transistor-1 cell (1tr-1cell). The plurality of pixels PIX is connected to a plurality of word lines WL, a plurality of bit lines BL and a plurality of source lines SL. Each of the plurality of pixels may be provided in a matrix form. Gate electrodes of the plurality of pixels are connected to the plurality of word lines WL. Drains of the plurality of pixels are connected to the plurality of bit lines BL. Sources of the plurality of pixels are connected to the plurality of source lines SL. The plurality of pixels may operate as an image sensor or a memory cell.

The row decoder 112 may receive a row address ADDR_row from the control unit 150. The row decoder 112 can activate a word line corresponding to the received row address ADDR_row.

The column decoder 113 may receive a column address ADDR_col from the control unit 150. The column decoder 113 can activate a bit line or a source line corresponding to the received column address ADDR_col.

The sense amplifier & the write driver 114 are connected to a plurality of bit lines BL connected to the pixel array 111. The sense amplifier & the write driver 114 senses a voltage change of an activated bit line among the plurality of bit lines BL and amplifies the voltage change to output it. The sense amplifier & the write driver 114 can control voltages of the plurality of bit lines BL so that the plurality of pixels PIX has any one data state of "data 0" and "data 1".

The input/output buffer 115 can output data based on a voltage amplified by the sense amplifier & the write driver 114. Data being output may be binary data indicating one of "data 0" and "data 1".

Figure 3:
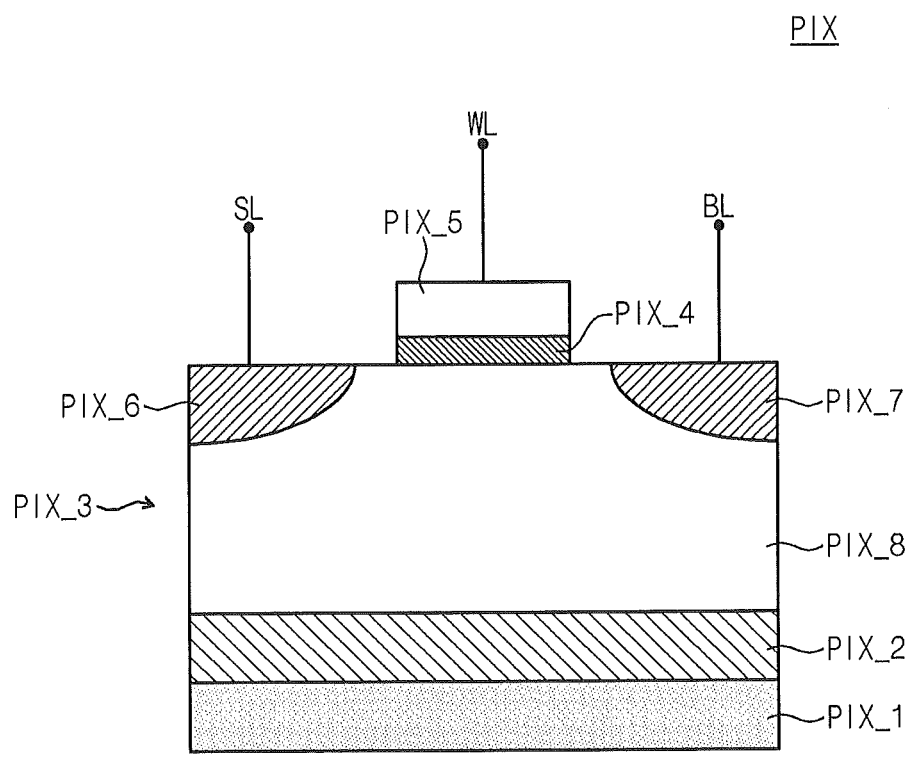
FIG. 3 is a drawing illustrating a structure of a pixel of FIG. 2 in greater detail.

FIG. 3 is a drawing illustrating a structure of a pixel of FIG. 2 in detail. Although not illustrated in the drawing, a plurality of pixels of the pixel arrays included in the first to fourth banks 110 to 140 may have the same structure as the pixel PIX illustrated in FIG. 3. The pixel PIX illustrated in FIG. 3 has an NMOS structure but the inventive concept is not limited thereto. The pixel PIX illustrated in FIG. 3 may have a PMOS structure.

Referring to FIGS. 2 and 3, the pixel PIX includes an n-type silicon layer PIX_1, a first insulating layer PIX_2, a p-type silicon layer PIX_3, a second insulating layer PIX_4 and a gate electrode PIX_5. The first insulating layer PIX_2 is formed on the n-type silicon layer PIX_1. The p-type silicon layer PIX_3 is formed on the first insulating layer PIX_2. The p-type silicon layer PIX_3 includes a source region PIX_6 and a drain region PIX_7 which are doped with n-type impurity. The source region PIX_6 and the drain region PIX_7 are formed to be spaced a predetermined distance apart from each other. The second insulating layer PIX_4 and the gate electrode PIX_5 are stacked on the p-type silicon layer PIX_3. The source region PIX_6 is connected to a source line SL, the drain region PIX_7 is connected to a bit line BL and the gate electrode PIX_5 is connected to a word line WL. A floating body region PIX_8 is formed in the p-type silicon layer PIX_3. That is, the pixel PIX may have a structure of a floating body transistor.

The pixel PIX may operate as an image sensor or a memory cell according to an operation mode. In the case that the pixel PIX operates as an image sensor, a predetermined negative voltage is applied to a word line WL and a charge storage space is formed in the floating body region PIX_8 (reset operation). At this time, a positive voltage is applied to a bit line BL and a ground voltage is applied to a source line SL. After that, if light is irradiated into the floating body region PIX_8, a pair of electron-hole is formed. Electron of the pair of electron-hole is emitted through a bit line BL and hole of the pair of electron-hole is accumulated in the charge storage space of the floating body region PIX_8. That is, the pixel PIX into which light is irradiated becomes a state in which a current flows well as compared with the pixel PIX into which light is not irradiated. A data state of the pixel PIX may be determined based on a current conducting state of the pixel PIX (an integrate operation).

In the case that the pixel PIX operates as a memory cell, a positive voltage is applied to a word line WL and a precharge voltage is applied to a bit line BL and a source line SL. As a result, the pixel PIX is turned on. After that, a voltage of the source line SL changes to a ground voltage, and a voltage of the bit line BL maintains a precharge voltage and thereby an operation of a parasitic bipolar transistor becomes effective. A forward bias (e.g., a forward bias of pn junction) between the floating body region PIX_8 and the source region PIX_6 is formed and thereby the parasitic bipolar transistor begins operation. At this time, a large quantity of hole carriers is accumulated in the floating body region PIX_8 and thereby the pixel PIX has a first data state of "data 1". In example embodiments, the parasitic bipolar transistor may be an npn junction BJT constituted by the source region PIX_6, the floating body region PIX_8 and the drain region PIX_7.

On the other hand, if a voltage of the bit line BL changes from a precharge voltage to a ground voltage, the parasitic bipolar transistor is turned off. A hole carrier of the floating body region PIX_8 is emitted to the source line SL and the bit line BL and thereby the pixel PIX has a second data state of "data 0".

In other words, when the parasitic bipolar transistor is turned on, the pixel PIX may have a state of "data 1" and when the parasitic bipolar transistor is turned off, the pixel PIX may have a state of "data 0".

Figure 4:
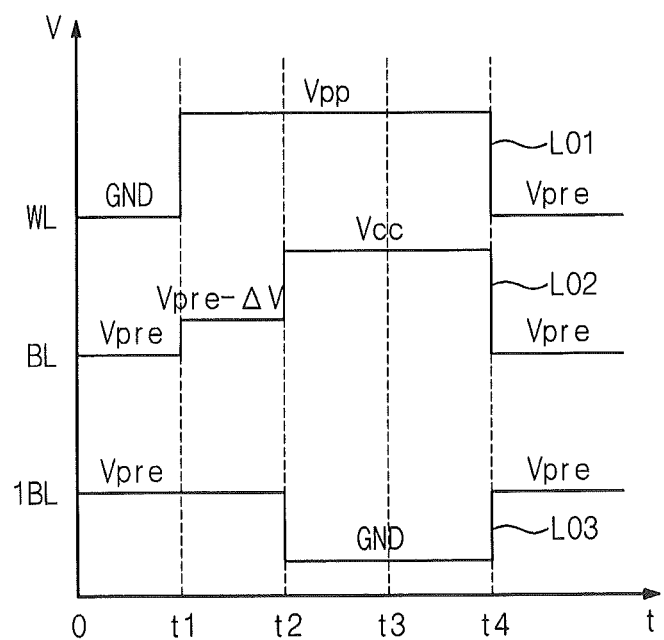
FIGS. 4 and 5 are graphs illustrating a read operation of the semiconductor device of FIG. 1.
Figure 5:
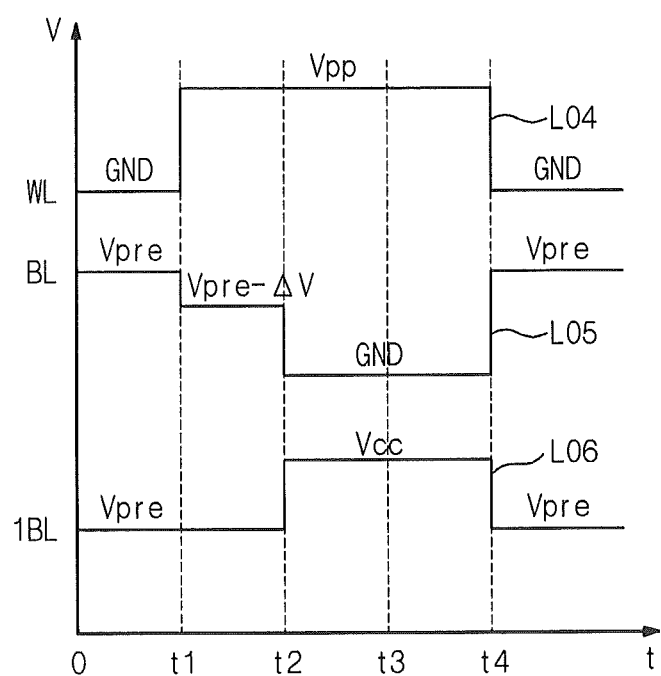

FIGS. 4 and 5 are graphs illustrating a read operation of the semiconductor device of FIG. 1. A read operation of any one pixel PIX of the plurality of pixels included in the pixel array 111 is described with reference to FIGS. 4 and 5. However, the inventive concepts are not limited thereto and the same or similar operations as described with reference to FIGS. 4 and 5 may be applied to other pixels.

Referring to FIGS. 2 and 4, a read operation of when a pixel PIX has a data state of "data 1" is described. First through third lines L01~L03 indicate a word line (WL) voltage, a bit line (BL) voltage and a reverse bit line (/BL) voltage respectively.

A first section t0-t1 is a section of precharging a bit line BL. A word line voltage in the first section t0-t1 is GND, and a bit line and a reverse bit line voltages are a precharge voltage.

A second section t1-t2 is a section of detecting a data state of a pixel connected to a selected bit line. A word line voltage in the second section t1-t2 changes to a power supply voltage Vpp. In the case that the pixel PIX has a data state of "data 1", the pixel PIX is turned on and thereby a bit line voltage is increased by a predetermined level ΔV.

In a third section t2-t3, a sense amplifier & write driver 114 compares a bit line voltage and a reverse bit line voltage. The amplifier & write driver 114 amplifies the bit line voltage and the reverse bit line voltage according to a comparison result to transmit the amplified bit line voltage and the reverse bit line voltage to the input/output buffer 115. For example, when the bit line voltage is higher than the reverse bit line voltage, the sense amplifier & write driver 114 can amplify the bit line voltage to Vcc and lower the reverse bit line voltage to GND. The Vcc may be lower than GND.

In a fourth section t3-t4, the input/output buffer 115 compares the amplified bit line voltage and the reverse bit line voltage to detect a data state of "data 1" of a pixel PIX, and then outputs the detected data state. After that, the word line voltage transits to GND again and the bit line voltage and the reverse bit line voltage transit to a precharge voltage.

Referring to FIGS. 2 and 5, a first section t0-t1 is the same as the first section t0-t1 of FIG. 4. In a second section t1-t2, a word line voltage changes to a power supply voltage Vpp, a bit line voltage is reduced by a predetermined level ΔV. After that, in a third section t2-t3, the sense amplifier & write driver 114 compares a bit line voltage and a reverse bit line voltage. The sense amplifier & write driver 114 amplifies the bit line voltage and the reverse bit line voltage based on a comparison result. In the case that the bit line voltage is lower than the reverse bit line voltage, the sense amplifier & write driver 114 can lower the bit line voltage to GND and amplify the reverse bit line voltage to Vcc.

In a fourth section t3-t4, the input/output buffer 115 compares the amplified bit line voltage and the reverse bit line voltage to detect a data state of "data 0" of a pixel PIX, and then outputs the detected data state. After that, the word line voltage transits to GND again and the bit line voltage and the reverse bit line voltage transit to a precharge voltage.

Figure 6:
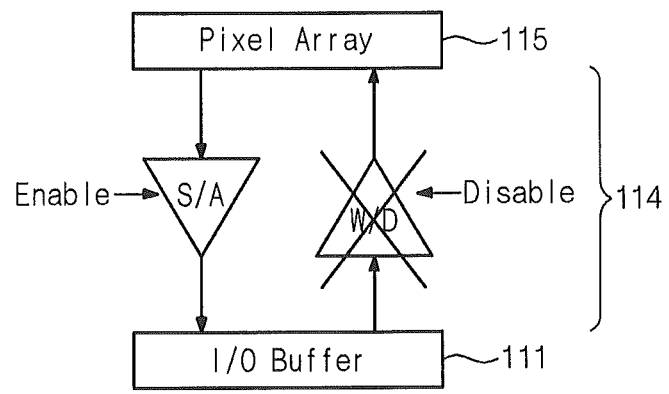
FIG. 6 is a drawing illustrating an image sensor operation mode of the semiconductor device of FIG. 1.

FIG. 6 is a drawing illustrating an image sensor operation mode of the semiconductor device of FIG. 1. For ease of description, the row decoder 112 and the column decoder 113 of the first bank 110 are omitted. The image sensor mode of the first bank 110 is described with reference to FIG. 6, however, the second through fourth banks 120~140 can also perform an image sensor operation mode based on the method described with reference to FIG. 6.

Referring to FIGS. 1 and 6, the semiconductor device 100 can receive a command CMD from an external device. In the case that the received command CMD indicates the image sensor mode of the first bank 110, the semiconductor device 100 can perform an image sensor mode operation of the first bank 110 in response to the received command CMD. Each of a plurality of pixels included in the pixel array 111 of the first bank 110 may receive light to form a data state as described with reference to FIG. 3. A sense amplifier of the sense amplifier & write driver 114 can detect data states of pixels included in the pixel array 111. For example, the semiconductor device 100 can detect data states of pixels based on the method described with reference to FIGS. 4 and 5.

In other words, the pixels of the pixel array 111 may receive light to form data states and data states of the pixels of the pixel array 111 may be detected in response to the received command CMD. In example embodiments, in the case that the semiconductor device 100 operates as an image sensor mode, a write driver of the sense amplifier & write driver 114 may be disabled.

Figure 7:
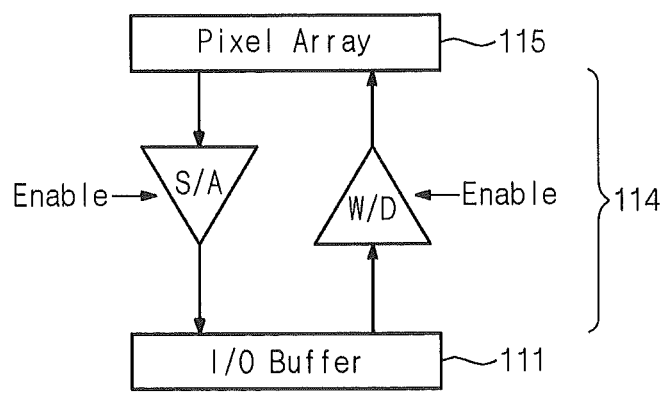
FIG. 7 is a drawing illustrating a memory operation mode of the semiconductor device of FIG. 1.

FIG. 7 is a drawing illustrating a memory mode operation of the semiconductor device of FIG. 1. Referring to FIGS. 1 and 7, the semiconductor device 100 can receive a command CMD from an external device. In the case that the received command CMD indicates a memory mode operation of the first bank 110, the semiconductor device 100 can perform the memory mode operation of the first bank 110. In the case that the received command CMD indicates a memory mode operation of the first bank 110, the semiconductor device 100 can receive a read/write request, an address ADDR, data DATA, etc. from an external device. In the case that the semiconductor device 100 receives a read request from an external device, a sense amplifier of the sense amplifier & write driver 114 can read data of pixels corresponding to the received address ADDR among the pixels included in the first bank 110 based on the method described with reference to FIGS. 4 and 5. In the case that the semiconductor device 100 receives a write request from an external device, a write driver of the sense amplifier & write driver 114 can write the received data in pixels corresponding to the received address ADDR among the pixels included in the first bank 110 based on the method described with reference to FIG. 3.

The semiconductor device 100 can perform a read or write operation on the pixel array 111 in response to the received command CMD (memory mode).

Figure 8:
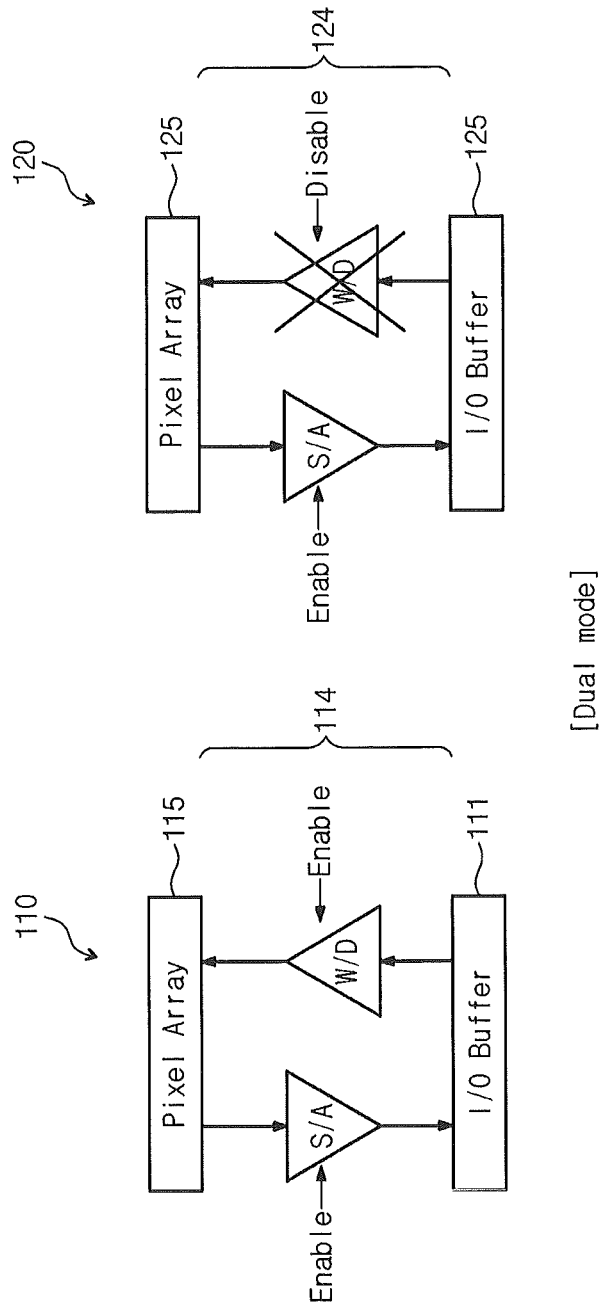
FIG. 8 is a drawing illustrating a dual operation mode of the semiconductor device of FIG. 1.

FIG. 8 is a drawing for describing a dual operation mode of the semiconductor device of FIG. 1. The first bank 110 includes a pixel array 111, a sense amplifier & write driver 114 and an input/output buffer 115. The second bank 120 includes a pixel array 121, a sense amplifier & write driver 124 and an input/output buffer 125. The first bank 110 which operates as a memory mode and the second bank 120 which operates as an image sensor mode are described with reference to FIG. 8.

Referring to FIGS. 1 and 8, the semiconductor device 100 can receive a command CMD from an external device. The received command CMD may indicate a memory mode operation of the first bank 110 and an image sensor mode operation of the second bank 120. In this case, the first bank 110 may operate based on the method described with reference to FIG. 6. The second bank 120 may operate based on the method described with reference to FIG. 7.

According to some example embodiments of the inventive concept, the semiconductor device 100 may include a plurality of banks, and ones the plurality of banks may operate as an image sensor mode or a memory mode, respectively. Each of the plurality of banks can independently operate. Thus, since an image sensor and a memory device are provided in a same chip, a semiconductor device having a small area and improved performance can be provided.

Figure 9:
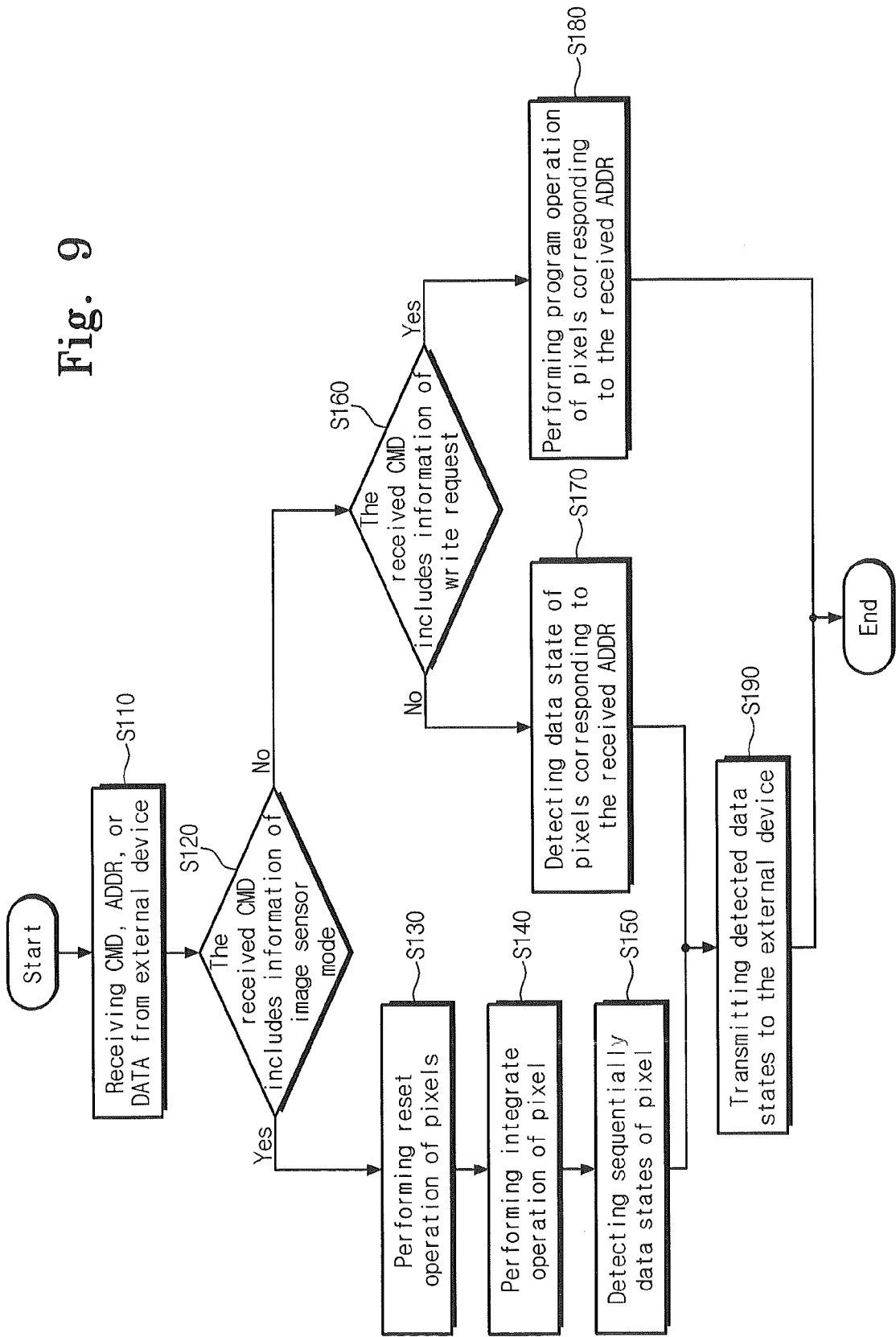
FIG. 9 is a flow chart illustrating operations of the semiconductor device of FIG. 1.

FIG. 9 is a flow chart illustrating operations of the semiconductor device of FIG. 1. An operation of the first bank 110 is described with reference to FIG. 9. However, the inventive concepts are not limited thereto, and the second to fourth banks 120 to 140 can also operate in the manner described with reference to FIG. 9. The first to fourth banks 110 to 140 can further operate together based on the method described with reference to FIG. 9.

Referring to FIGS. 1 and 9, in step S110, the semiconductor device 100 can receive a command CMD, an address ADDR, or data DATA from an external device (e.g., a host, a controller, a chipset, etc.). In the case that the received command CMD includes memory mode information, the semiconductor device 100 can receive an address ADDR and data DATA.

In step S120, the semiconductor device 100 can distinguish whether the received command CMD includes image sensor mode information. For example, the received command CMD may include or otherwise be indicative of any one of an image sensor mode and a memory mode. The semiconductor device 100 can distinguish whether the received command CMD includes image sensor mode information, or whether the received command CMD includes memory mode information.

In the case that the received command CMD includes image sensor mode information, in step S130, the semiconductor device 100 performs a reset operation of the pixel array 111 included in the first bank 110. The reset operation is an operation of erasing data stored in pixels included in the pixel array 111.

In step S140, the semiconductor device 100 performs an operation of storing a data state in the pixel array 111 according to light irradiated into the pixel array 111 (i.e., an integrate operation). The semiconductor device 100 can store a data state in the pixel array 111 based on the data write method of pixel PIX when the bank operates in an image sensor mode described with reference to FIG. 3.

In step S150, the semiconductor device 100 can detect a data state stored in pixels of the pixel array 111. For example, the semiconductor device 100 can detect data states of pixels by sequentially activating a plurality of bit lines and a plurality of word lines which are connected to the pixels of the pixel array 111. In example embodiments, the semiconductor device 100 can detect data states based on the method described with reference to FIGS. 4 and 5.

In the case that the received command CMD includes memory mode information, the received command CMD may include a write request or a read request. In step S160, the semiconductor device 100 can distinguish whether the received command CMD includes a write request or whether the received command CMD includes a read request.

In the case that the received command CMD includes memory mode information and a write request, in step S170, the semiconductor device 100 can write the received data in pixels corresponding to the received address ADDR. The semiconductor device 100 can write the received data in pixels corresponding to the received address ADDR based on the data write method of pixel PIX when the bank operates in a memory mode described with reference to FIG. 3.

In the case that the received command CMD includes memory mode information and a read request, in step S180, the semiconductor device 100 can detect data states stored in pixels corresponding to the received address ADDR. The semiconductor device 100 can detect data states stored in pixels corresponding to the received address ADDR based on the method described with reference to FIGS. 4 and 5.

After the steps S150 and/or S180, the semiconductor device 100 can transmit the detected data to an external device.

According to some example embodiments of the inventive concept, the semiconductor device 100 includes a plurality of banks 110 to 140 and each bank can be independently operated. The plurality of banks 110 to 140 may operate in an image sensor mode and/or in a memory mode. Thus, a semiconductor device having a small area and improved performance may be provided.

Figure 10:
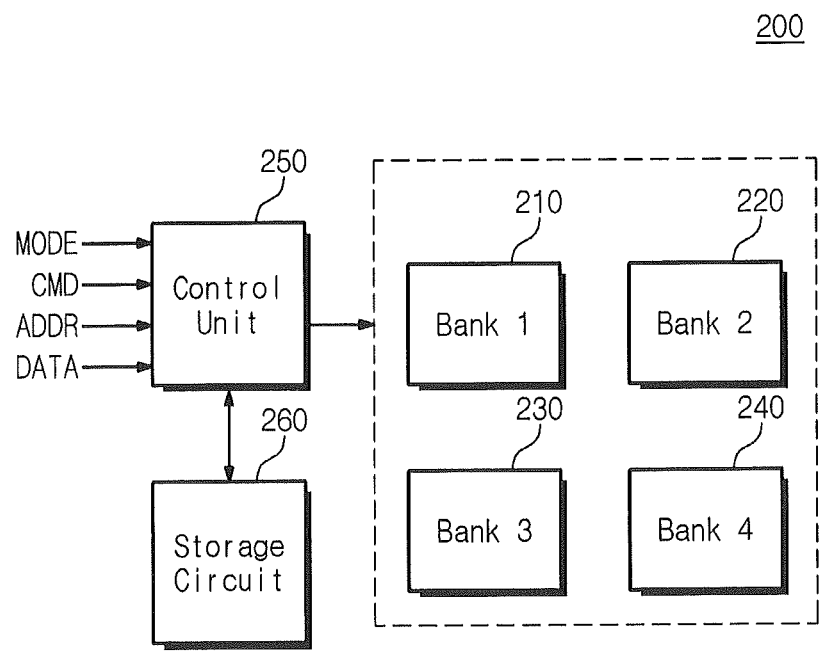
FIG. 10 is a block diagram illustrating a semiconductor device in accordance with other embodiments of the inventive concepts.

FIG. 10 is a block diagram illustrating a semiconductor device in accordance with another embodiment of the inventive concepts. Referring to FIG. 10, a semiconductor device 200 includes first to fourth banks 210 to 240, a control unit 250 and a storage circuit 260. In contrast with the semiconductor device 100 of FIG. 1, the semiconductor device 200 may further include the storage circuit 260.

The storage circuit 260 includes operation information of the first to fourth banks 210 to 240. When an initial operation of the semiconductor device 200 is performed (for example, when the semiconductor device is powered on), the control unit 250 can receive mode information MODE from an external device. The mode information MODE may include respective operation mode information for the first to fourth banks 210 to 240. The control unit 250 can store the operation mode information for each of the first to fourth banks 210 to 240 in the storage circuit 260 based on the received operation mode information MODE. In the case that the control unit 250 receives the mode information MODE from an external device, the operation mode information of the first to fourth banks 210 to 240 stored in the storage circuit 260 may be updated. The storage circuit 260 may be provided as a fuse circuit, a mode register, and so on.

The control unit 250 can control the first to fourth banks 210 to 240 based on the operation mode information of the first to fourth banks 210~240 stored in the storage circuit 260.

The control unit 250 can distinguish whether the operation mode information stored in the storage circuit 260 and the command CMD received from the external device correspond to each other. In the case that the command CMD received from the outside includes memory mode information of the first bank 210 and the operation mode information stored in the storage circuit 260 indicates a memory mode operation of the first bank 210, in response to received command CMD, the control unit 250 receives an address ADDR and data DATA and performs the memory mode operation of the first bank 210. Since the memory mode operation was described with reference to FIGS. 1 to 8, further description thereof is omitted.

However, in the case that the command CMD received from the outside includes memory mode information of the first bank 210 and the operation mode information stored in the storage circuit 260 indicates an image sensor mode operation of the first bank 210, in response to received command CMD, the control unit 250 does not perform an operation on the command CMD or transmits an abort signal to an external device.

Figure 11:
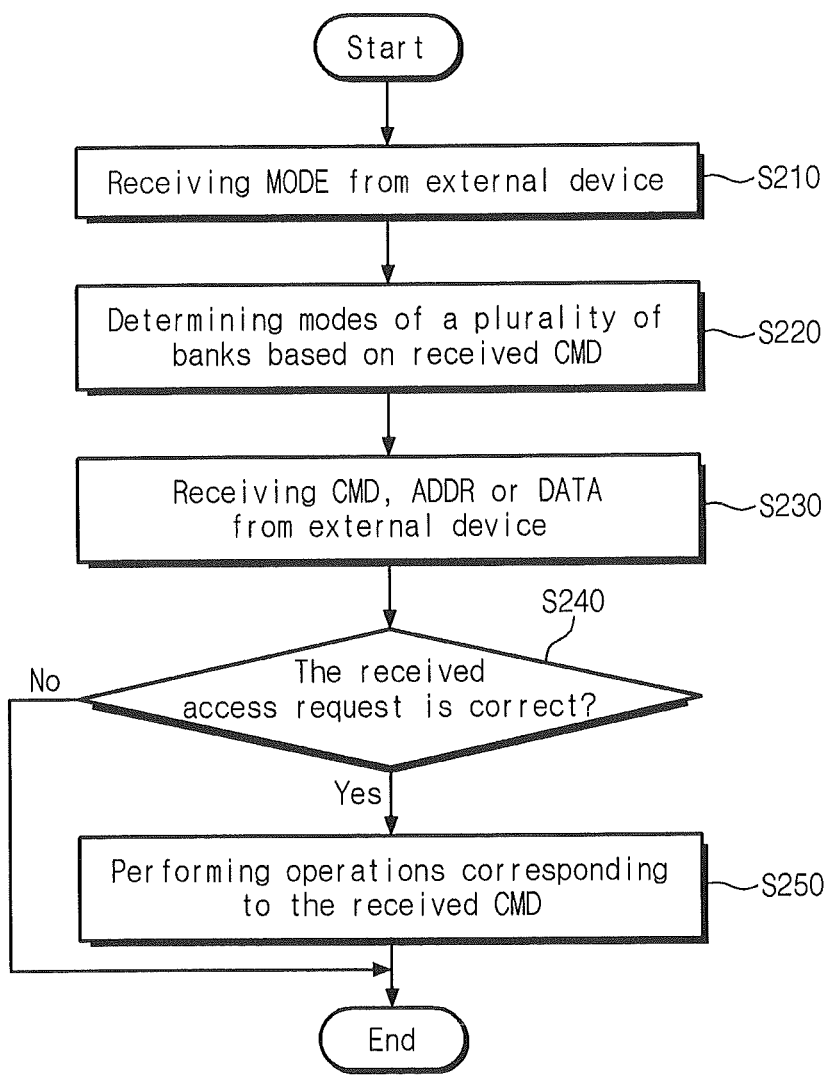
FIG. 11 is a flow chart illustrating operations of the semiconductor device of FIG. 10.

FIG. 11 is a flow chart illustrating operations of the semiconductor device of FIG. 10. Referring to FIGS. 9 and 11, in step S210, the semiconductor device 200 may receive mode information MODE from an external device. The mode information MODE may include operation mode information for one or more banks included in the semiconductor device 200.

In step S220, the semiconductor device 200 may determine operation modes for the banks based on the received mode information MODE. The control unit 250 may determine an operation mode of each bank based on the received mode information MODE and store the determined operation mode information in the storage circuit 260.

In step S230, the semiconductor device 200 may receive a command CMD from an external device. The semiconductor device 200 may receive an access request for at least one of the banks from an external device. The received command CMD may include operation mode information. In the case that the received command CMD is a memory operation mode, an address or data may be further received.

In step S240, the semiconductor device 200 can distinguish whether the received command CMD and the operation mode information stored in the storage circuit 260 correspond to each other. For example, when the received command CMD indicates a memory mode operation of the first bank 210 and the operation mode information stored in the storage circuit 260 indicates the memory mode operation of the first bank 210, the control unit 250 judges that the received command CMD corresponds to the operation mode information stored in the storage circuit 260. However, in the case that the received command CMD indicates a memory mode operation of the first bank 210 and the operation mode information stored in the storage circuit 260 indicates an image sensor mode operation of the first bank 210, the control unit 250 judges that the received command CMD does not correspond to the operation mode information stored in the storage circuit 260.

Responsive to the distinguishing, in the case that the received command CMD and the operation mode information stored in the storage circuit 260 corresponds to each other, in step S250, the semiconductor device 200 may operate in response to the received command CMD. In the case that the received command CMD indicates an image sensor mode of the first bank 210, the semiconductor device 200 may operate based on the method described with reference to the steps S130 through S150 of FIG. 9. In the case that the received command CMD indicates a memory mode of the first bank 210, the semiconductor device 200 may operate based on the method described with reference to the steps S160 through S180 of FIG. 9.

According to another embodiment of the inventive concepts, the semiconductor device 200 may receive mode information MODE from an external device and set operation modes of the banks based on the received mode information MODE. The semiconductor device 200 can independently control the banks so that the banks operate in different modes respectively based on the operation mode that was set. Thus, a semiconductor device having a small area and improved performance may be provided.

Figure 12:
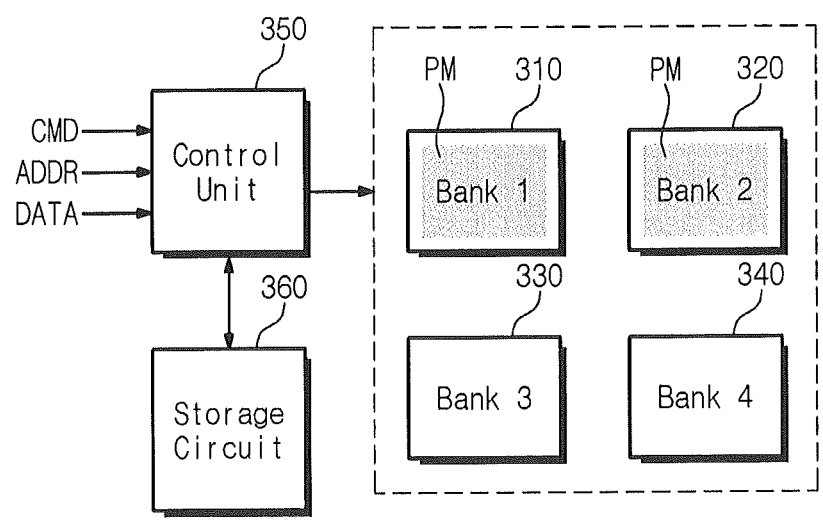
FIG. 12 is a block diagram illustrating a semiconductor device in accordance with still other embodiments of the inventive concepts.

FIG. 12 is a block diagram illustrating a semiconductor device in accordance with still another embodiment of the inventive concepts. Referring to FIG. 12, a semiconductor device 300 includes first to fourth banks 310 to 340, a control unit 350 and a storage circuit 360. In contrast to the semiconductor device 200 of FIG. 10, the semiconductor device 300 of FIG. 12 includes first and second banks 310 and 320 including a photo mask PM.

The first and second banks 310 and 320 may operate in a memory mode. The third and fourth banks 330 and 340 may operate in an image sensor mode. In contrast to the semiconductor device 200 of FIG. 10, in the semiconductor device 300 of FIG. 12, an operation mode of each bank is previously determined.

The third and fourth banks 330 and 340 may be the same as the third and fourth banks 230 and 240 of FIG. 10. In contrast to the first and second banks 210 and 220 of FIG. 10, the first and second banks 310 and 320 further include a photo mask PM. The photo mask PM has a function of reducing and/or preventing irradiation of light into pixels included in the first and second banks 310 and 320. One pixel of the pixels included in the first and second banks 310 and 320 will be described with reference to FIG. 13 in detail.

The storage circuit 360 may include previously determined operation mode information of each bank. The control unit 350 may receive a command CMD from an external device and operate based on the previously determined operation mode included in the storage circuit 360. The control unit 350 may operate based on the method described with reference to the steps S230 through S250 of FIG. 11.

Figure 13:
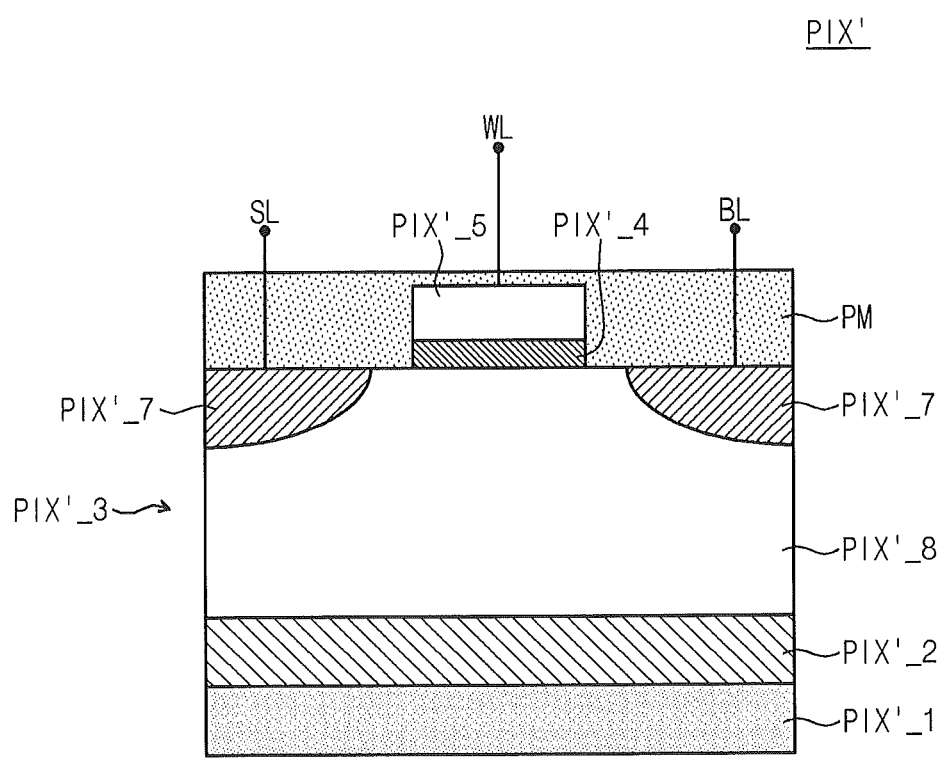
FIG. 13 is a drawing illustrating one of the plurality of pixels included in a first bank illustrated in FIG. 12.

FIG. 13 is a drawing illustrating one of a plurality of pixels included in a first bank illustrated in FIG. 12. Referring to FIG. 13, a PIX' includes an n-type silicon layer PIX'_1, a first insulating layer PIX'_2, a p-type silicon layer PIX'_3, a second insulating layer PIX'_4, a gate electrode PIX'_5 and a photo mask layer PM. The p-type silicon layer PIX'_3 includes a source region PIX'_6 and a drain region PIX'_7 that are doped with an n-type impurity. Since the n-type silicon layer PIX'_1, the first insulating layer PIX'_2, the p-type silicon layer PIX'_3, the second insulating layer PIX'_4, the gate electrode PIX'_5, the source region PIX'_6 and the drain region PIX'_7 were described with reference to FIG. 3, further description thereof will be omitted.

The photo mask layer PM has a function of blocking out light so that irradiation of light into a floating body region PIX'_8 is reduced or prevented. In the case that a pix PIX' is used as a memory cell, the pixel PIX' has to maintain any one state of "data 0" and "data 1" for predetermined time. However, in the case that light is irradiated into the floating body region PIX'_8, a data state stored in the pixel PIX' may be changed. A data change of the pixel PIX' may be prevented by making the photo mask layer PM block out light being irradiated into the floating body region PIX'_8.

According to still another embodiment of the inventive concept, each of banks may operate in any one operation mode of the image sensor mode and the memory mode. Banks which operate in the memory mode may further include a photo mask layer, in contrast with banks which operate in the image sensor mode. The photo mask layer PM blocks out light being irradiated into the pixel PIX' and thereby a data change of the pixel PIX' may be reduced or prevented. Thus, a semiconductor device having a reduced area and improved performance may be provided.

Figure 14:
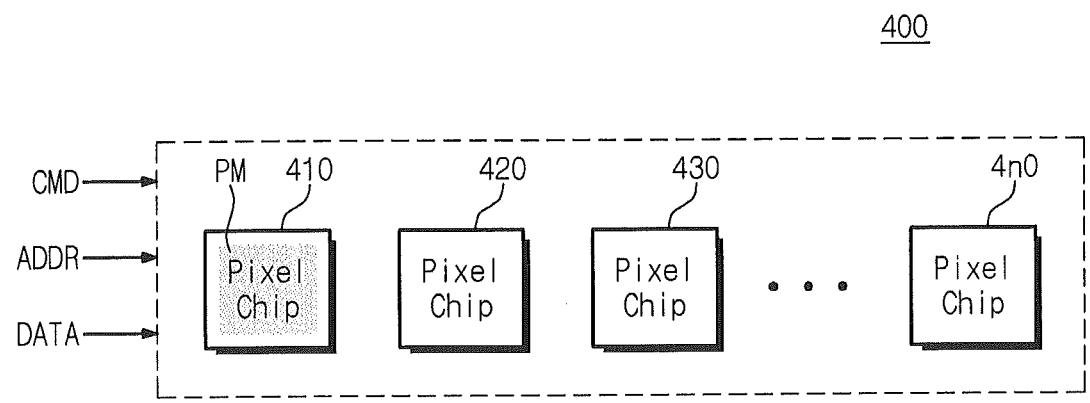
FIG. 14 is a block diagram illustrating a semiconductor module in accordance with still further embodiments of the inventive concepts.

FIG. 14 is a block diagram illustrating a semiconductor module in accordance with still another embodiment of the inventive concept. Referring to FIG. 14, a semiconductor module 400 may include a plurality of semiconductor chips 410 to 4n0. Each of semiconductor chips may operate in any one operation mode of the memory mode and the image sensor mode. For example, the first semiconductor chip 410 may operate in the memory mode. The second semiconductor chip 420 may operate in the image sensor mode. The semiconductor module 400 can receive a command CMD from an external device to control the first and second semiconductor chips 410 and 420 based on the method described with reference to FIGS. 1 through 13. The first semiconductor chip 410 may include a photo mask layer so that light is not irradiated into a plurality of pixels included in the first semiconductor chip 410.

Figure 15:
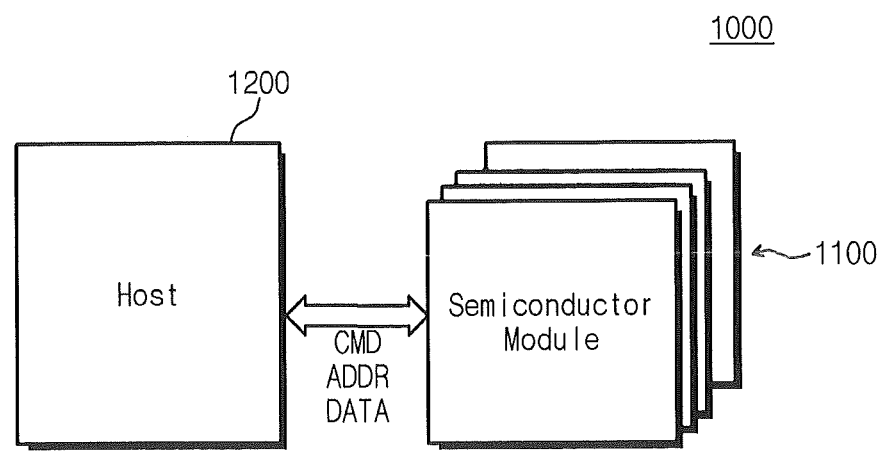
FIG. 15 is a block diagram schematically illustrating a user system to which semiconductor modules in accordance with some embodiments of the inventive concepts may be applied.

FIG. 15 is a block diagram schematically illustrating a user system to which semiconductor modules in accordance with some embodiments of the inventive concepts can be applied. A user system 1000 may include a host 1100 and a semiconductor module 1200. The semiconductor module 1200 may include a plurality of semiconductor devices. The plurality of semiconductor devices. The plurality of semiconductor devices may be the semiconductor devices described with reference to FIGS. 1 to 14. The host 1100 and the semiconductor module 1200 may exchange a command CMD, an address ADDR and data DATA with each other. The host 1100 may determine an operation mode of the semiconductor module 1200 or each of semiconductor devices included in the semiconductor module 1200 by transmitting a command CMD to the semiconductor module 1200. The semiconductor module 1200 may operate based on the method described with reference to FIGS. 1 through 14 in response to the received command CMD.

The semiconductor module 1200 includes a plurality of semiconductor devices and the plurality of semiconductor devices may independently operate based on different operation modes respectively. A semiconductor module performing the image sensor mode and the memory mode together is provided. Thus, performance of the semiconductor module is improved and an area of the semiconductor module is reduced.

Figure 16:
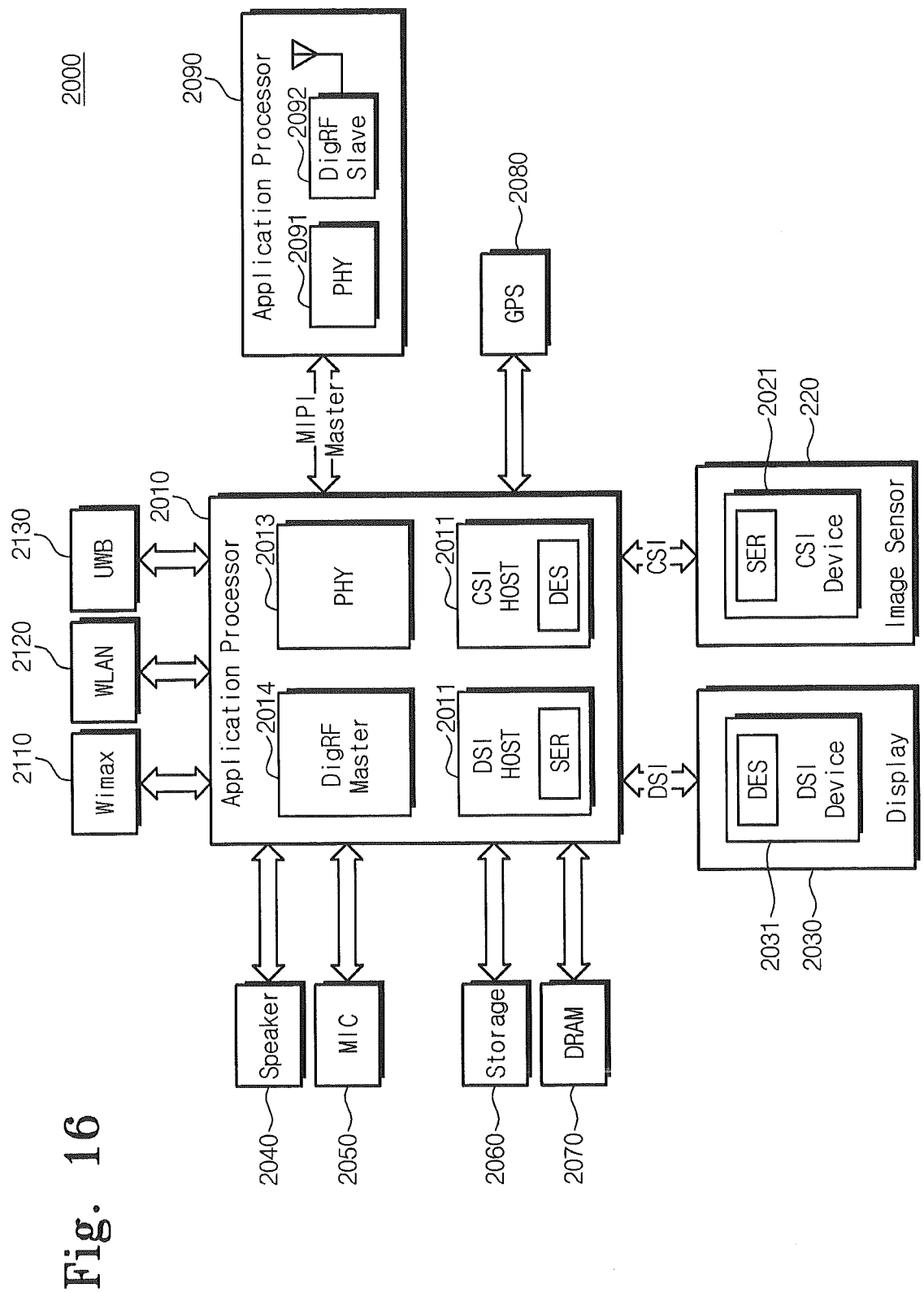
FIG. 16 is a block diagram schematically illustrating an electronic system to which semiconductor devices in accordance with some embodiments of the inventive concepts may be applied.

FIG. 16 is a block diagram schematically illustrating an electronic system to which semiconductor devices in accordance with some embodiments of the inventive concepts can be applied. Referring to FIG. 16, an electronic system 2000 may be embodied by a data processing device (e.g., a mobile phone, a PDA, a PMP, a smart phone, a digital camera, etc.) that can use or support a mobile industry processor interface (MIPI). The electronic system 2000 includes an application processor 2010, an image sensor 2020, a display 2030, a speaker 2040, a mike 2050, a storage 2060, a DRAM 2070 and a GPS 2080.

A camera serial interface (CSI) host 2011 embodied in the application processor 2010 can serially-communicate with a CSI device 2021 included in the image sensor 2020 through the camera serial interface (CSI). A photo deserializer may be embodied in the CSI host 2011 and a photo serializer may be embodied in the CSI device 2021.

A display serial interface (DSI) host 2012 embodied in the application processor 2010 can serially-communicate with a DSI device 2031 of the display 2030 through a display serial interface DSI. A photo serializer may be embodied in the DSI host 2012 and a photo deserializer may be embodied in the DSI device 2031.

The electronic system 2000 may further include an RF chip 2090 that can communicate with the application processor 2010. A PHY 2013 of the electronic system 2000 and a PHY 2091 of the RF chip 2090 can exchange data with each other according to MIPI DigRF.

The electronic system 2000 can communicate with an external device using a world interoperability for microwave access (Wimax) 2110, a wireless LAN (WLAN) 2120 and/or an ultra wideband (UWB) 2130.

The image sensor 2020 and the DRAM 2070 may be embodied by the semiconductor devices and/or the semiconductor modules described with reference to FIGS. 1 to 14. In the case that the semiconductor devices and the semiconductor modules described with reference to FIGS. 1 to 14 operate in the image sensor mode, the semiconductor devices and the semiconductor modules may be used to implement the image sensor 2020 of FIG. 16. In the case that the semiconductor device and the semiconductor module described with reference to FIGS. 1 to 14 operate in the memory mode, the semiconductor device and the semiconductor module may be used to implement the DRAM 2070 of FIG. 16. In the case that the semiconductor devices and the semiconductor modules described with reference to FIGS. 1 to 14 operate in the dual mode, the image sensor 2020 and the DRAM 2070 of FIG. 16 may be provided as one chip or one module.

Figure 17:
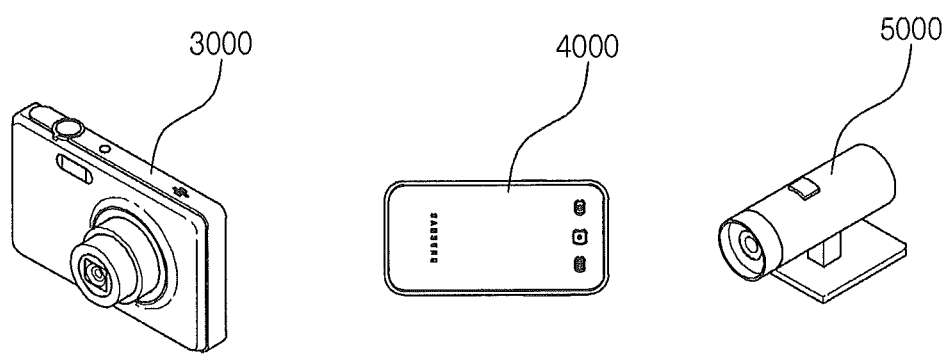
FIG. 17 is a drawing schematically illustrating an application example to which semiconductor devices in accordance with some embodiments of the inventive concepts may be applied.

FIG. 17 is drawings schematically illustrating an application example to which semiconductor devices in accordance with some embodiments of the inventive concepts can be applied. Referring to FIG. 17, the semiconductor devices may be applied to a system including an image sensor and a memory device such as a digital camera, a cell phone, a webcam, etc. A digital camera 3000, a cell phone 4000 and a webcam 5000 perform an operation of shooting/capturing an external image and storing the image. Semiconductor devices in accordance with some embodiments of the inventive concepts can operate as an image sensor mode in the digital camera 3000, the cell phone 4000 and/or the webcam 5000 to shoot an external image. Semiconductor devices in accordance with some embodiments of the inventive concepts can also operate as a memory mode in the digital camera 3000, the cell phone 4000 and/or the webcam 5000 to store data or perform a function of a buffer between an auxiliary memory device and a processor.

According to some example embodiments of the inventive concept, the semiconductor device includes a plurality of banks and the banks operate in different modes respectively. Since the banks independently operate, when detecting data of pixels included in the banks, data detection time is shortened. Since an RC value connected to a bit line is reduced, a conversion gain $\Delta V$ for detecting data can be increased in an output circuit. Thus, a semiconductor device having improved performance and a reduced area and an operation method thereof are provided.

Although example embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A semiconductor device comprising:
a plurality of banks; and
a control unit configured to receive a command from an external device and independently control the plurality of banks according to the received command,
wherein each bank comprises:
a pixel array including a plurality of pixels;
a row decoder configured to activate word lines connected to the plurality of pixels under control of the control unit;
a column decoder configured to activate bit lines connected to the plurality of pixels under control of the control unit;
a sense amplifier and write driver configured to control and detect respective voltages of the activated bit lines to provide respective amplified voltages; and
an input/output buffer configured to output data states of the pixels based on the respective amplified voltages,
wherein the command comprises operation mode information for at least one of the banks,
wherein the operation mode information comprises image sensor mode information or memory mode information, and
wherein the control unit is configured to control at least one of the banks according to the operation mode information such that the at least one of the banks operates in an image sensor mode or a memory mode.

2. The semiconductor device of claim 1, wherein each of the plurality of pixels comprises:
an n-type silicon layer;
a first insulating layer on the n-type silicon layer;
a p-type silicon layer on the first insulating layer;
a second insulating layer on the p-type silicon layer; and
a gate electrode on the second insulating layer,
wherein the p-type silicon layer comprises a drain region, a source region, and floating body region, and
wherein the drain region and the source region are spaced apart from each other and are doped with an n-type impurity.

3. The semiconductor device of claim 1, wherein the command comprises the image sensor mode information for the at least one of the banks, and wherein the control unit is configured to reset ones of the pixels included in the at least one of the banks in response to the command, to control the row decoder and the column decoder such that the reset ones of the pixels store respective data states according to light being irradiated thereon, and to detect the respective data states of the ones of the pixels.

4. The semiconductor device of claim 1, wherein the command comprises memory mode information for the at least one of the banks, wherein the control unit is configured to receive addresses and data from the external device, and wherein the control unit is configured to distinguish whether the command comprises a read request or a write request,
wherein, responsive to distinguishing that the command comprises a read request, the control unit is configured to detect respective data states of ones of the pixels corresponding to the received addresses and to transmit the detected data states to the external device, and
wherein, responsive to distinguishing that the command comprises a write request, the control unit is configured to write the received data in ones of the pixels corresponding to the received addresses.

5. The semiconductor device of claim 1, wherein the command comprises dual mode information indicating a memory mode for ones of the banks and an image sensor mode for other ones of the banks, wherein ones of the pixels included in the ones of the banks are configured to operate as a memory cell, and wherein others of the pixels included in the other ones of the banks are configured to operate as an image sensor.

6. The semiconductor device of claim 1, wherein each of the pixels included in the pixel array of at least one of the banks that is configured to operate in the memory mode comprises:
an n-type silicon layer;
a first insulating layer on the n-type silicon layer;
a p-type silicon layer on the first insulating layer;
a second insulating layer on the p-type silicon layer;
a gate electrode on the second insulating layer; and
a photo mask on the second insulating layer and the gate electrode,
wherein the p-type silicon layer comprises a drain region, a source region, and floating body region,
wherein the drain region and the source region are spaced apart from each other and are doped with an n-type impurity,
wherein the floating body region is configured to store holes, and
wherein the photo mask is configured to prevent external light from being irradiated into the floating body region.

7. The semiconductor device of claim 6, further comprising a storage circuit configured to store operation mode information for each of the banks,
wherein the control unit is configured to independently control each of the banks based on the corresponding operation mode information stored in the storage circuit.

8. A semiconductor device, comprising:
a plurality of banks respectively comprising an array of cells, each of the cells comprising a respective transistor; and
a control circuit configured to receive a signal indicative of an image sensor operation mode or a memory device operation mode for at least one of the banks from an external device, and to independently operate the at least one of the banks as an image sensor or as a memory device responsive to the signal,
wherein the respective transistor of each of the cells includes a source region, a drain region, and a floating body region therebetween, and wherein the control circuit is configured to detect respective data states of the cells based on charge carriers accumulated in the floating body region thereof,
wherein each of the banks further comprises a sense amplifier configured to detect the respective data states of the cells thereof and a write driver configured program the cells thereof, and wherein, in operating the at least one of the banks as the image sensor, the control circuit is configured to disable the write driver thereof.

9. The device of claim 8, wherein, in operating the at least one of the banks as the image sensor, the control circuit is configured to sequentially detect the respective data states of the cells of the at least one of the banks.

10. The device of claim 9, wherein, prior to sequentially detecting the respective data states of the cells, the control circuit is configured to apply a negative voltage to respective gate electrodes of the respective transistors, apply a positive voltage to the respective drain regions of the respective transistors, and apply a ground voltage to the respective source regions of the respective transistors.

11. The device of claim 8, wherein, in operating the at least one of the banks as the memory device, the control circuit is configured to receive an address signal from the external device, and to detect the respective data state of or program one of the cells of the at least one of the banks corresponding to the address signal.

12. The device of claim 11, wherein, in programming the one of the cells, the control circuit is configured to apply a positive voltage to a gate electrode of the respective transistor of the one of the cells corresponding to the address signal, to apply a precharge voltage to the source region and the drain region of the respective transistor of the one of the cells corresponding to the address signal, and to then apply a ground voltage to the source region.

13. The device of claim 12, wherein, in programming the one of the cells, the control circuit is further configured to maintain the precharge voltage to the drain region of the respective transistor of the one of the cells corresponding to the address signal to program a first data state therein, and to apply a ground voltage to the drain region of the respective transistor of the one of the cells corresponding to the address signal to program a second data state therein.

14. The device of claim 8, wherein the signal is indicative of the memory device operation mode for the at least one of the banks, and wherein the respective transistors of the cells in the at least one of the banks include a photomask layer on the floating body region thereof that is configured to block irradiation of incident light thereon.

15. The device of claim 8, wherein the signal is indicative of the image sensor operation mode for the at least one of the banks, and wherein the signal is received from the external device independent of an address signal and/or a data signal therefrom.

16. The device of claim 8, wherein the signal includes mode information indicative of the image sensor operation mode or the memory device operation mode for respective ones of the banks, and further comprising:
a storage circuit configured to store the mode information therein,
wherein the control circuit is further configured to receive a command signal from the external device, and is configured to operate the at least one of the banks as the image sensor or as the memory device responsive to a comparison of the command signal and the mode information.

17. The device of claim 8, wherein the signal comprises dual mode information indicative of the memory device operation mode for a first one of the banks and the image sensor operation mode for a second one of the banks, and wherein the controller is configured to independently operate the first one of the banks as the memory device and the second one of the banks as the image sensor responsive to the signal.

* * * * *